US008754794B1

(12) United States Patent
Li et al.

(10) Patent No.: US 8,754,794 B1
(45) Date of Patent: Jun. 17, 2014

(54) METHODS AND APPARATUS FOR CALIBRATING PIPELINE ANALOG-TO-DIGITAL CONVERTERS

(75) Inventors: Wei Li, Fremont, CA (US); Weiqi Ding, Fremont, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/558,136

(22) Filed: Jul. 25, 2012

(51) Int. Cl.
  *H03M 1/10* (2006.01)
(52) U.S. Cl.
  USPC ............ 341/120; 341/118; 341/119; 341/155; 341/156; 341/161
(58) Field of Classification Search
  USPC .................... 341/118, 120, 155, 161, 162
  See application file for complete search history.

(56) References Cited

U.S. PATENT DOCUMENTS

| | | | |
|---|---|---|---|
| 5,499,027 A | 3/1996 | Karanicolas et al. | |
| 6,169,502 B1* | 1/2001 | Johnson et al. | 341/120 |
| 6,384,757 B1* | 5/2002 | Kosonen | 341/120 |
| 6,489,904 B1* | 12/2002 | Hisano | 341/120 |
| 6,606,042 B2* | 8/2003 | Sonkusale et al. | 341/120 |
| 6,784,814 B1 | 8/2004 | Nair et al. | |
| 6,791,484 B1* | 9/2004 | Lee et al. | 341/118 |
| 7,035,756 B2 | 4/2006 | Maloberti et al. | |
| 7,071,856 B2 | 7/2006 | Tsai et al. | |
| 7,107,175 B2* | 9/2006 | Maloberti et al. | 702/126 |
| 7,142,138 B2* | 11/2006 | Chen et al. | 341/120 |
| 7,148,832 B2* | 12/2006 | Wada et al. | 341/155 |
| 7,378,999 B1* | 5/2008 | McGrath et al. | 341/120 |
| 7,602,323 B2* | 10/2009 | Galton et al. | 341/118 |
| 7,764,216 B2* | 7/2010 | Oshima et al. | 341/172 |
| 8,207,882 B1* | 6/2012 | Jennings | 341/162 |
| 2006/0109151 A1* | 5/2006 | Hsu | 341/120 |
| 2011/0043395 A1* | 2/2011 | Sun et al. | 341/120 |
| 2011/0210877 A1* | 9/2011 | Ali et al. | 341/120 |
| 2012/0038498 A1* | 2/2012 | Oshima et al. | 341/110 |

OTHER PUBLICATIONS

Treleaven, "1.5-Bit Stages In Pipeline ADCs" May 11, 2006, 3 pages [Retreived on Mar. 9, 2012]. Retrieved from the internet <electronicdesign.com/print/analog-and-mixed-signal/1-5-bit-stages-in-pipeline-adcs12451>.

* cited by examiner

*Primary Examiner* — Linh Nguyen
(74) *Attorney, Agent, or Firm* — Treyz Law Group; Jason Tsai

(57) ABSTRACT

An integrated circuit with a pipeline analog-to-digital (A/D) converter and associated calibration circuitry is provided. The A/D converter may include multiple series-connected pipeline stages at least some of which are implemented using a switched capacitor configuration. The calibration circuitry may include an analog error correction circuit, a digital error correction circuit, and a calibration control circuit for coordinating the operation of the analog and digital error correction circuits. During calibration operations, the analog error correction circuit may be used to suitably adjust a gain setting for each pipeline stage, whereas the digital error correction circuit may be used to compute a code offset value for each pipeline stage. Calibration may proceed from a least-significant-bit pipeline stage towards a most-significant-bit pipeline stage, one stage at a time.

14 Claims, 11 Drawing Sheets

METHODS AND APPARATUS FOR CALIBRATING PIPELINE ANALOG-TO-DIGITAL CONVERTERS

BACKGROUND

Integrated circuits often include data converters such as analog-to-digital (A/D) converters. An analog-to-digital converter is a device that is configured to convert a continuous analog signal to a discrete-time digital signal. For example, an analog-to-digital converter can be used to convert an input analog voltage (or current) to a corresponding digital representation that is proportional to the magnitude of the input analog voltage.

There are many different types of analog-to-digital converters. As examples, the different implementations include flash A/D converters, single-slope A/D converters, dual-slope A/D converters, successive approximation A/D converters, pipeline A/D converters, oversampled A/D converters, etc. For applications in which compact die area and high speed operation are primary objectives, pipeline A/D converters are often used.

A pipeline A/D converter includes a series cascade of lower resolution pipeline stages. The different pipeline stages operate concurrently, where the first stage processes the most recent analog sample while each successive stage operates on the analog remainder voltage (often referred to as a residual voltage) output from the previous pipeline stage.

A general pipeline stage may include a sample-and-hold (S/H) circuit, a low resolution A/D converter such as a low resolution flash A/D converter, a low resolution digital-to-analog (D/A) converter, a subtraction circuit, and a finite gain operational amplifier. Each stage uses the S/H circuit to sample and hold the residual voltage received from its previous stage. The low resolution flash A/D converter is configured to compare the held input (i.e., the held residual voltage received from the previous stage) with fixed threshold voltage reference levels.

With the low resolution A/D converter, the held input is converted into a low resolution digital signal. The low resolution digital signal is then converted back to analog using the low resolution D/A converter. This converted signal presented at the output of the low resolution D/A converter is subtracted from the held input to obtain a difference voltage using the subtraction circuit. This difference voltage is amplified using the finite gain operational amplifier to produce a corresponding residue voltage that is passed to the next stage. In some pipeline stage designs, the sample-and-hold, subtraction, and gain functionalities are integrated into a single switched capacitor circuit to reduce area overhead.

Because each of the pipeline stages operates simultaneously, the number of pipeline stages (which determines the resolution of the pipe A/D converter) is not limited by target throughput criteria. The resolution of a pipeline A/D converter may, however, be limited to no more than eight bits due to inter-stage gain error (i.e., error in the gain of the operational amplifier in each stage), variations in the amplifier gain, capacitor mismatch among the switched capacitor circuits, variations in the threshold voltage reference levels, and charge injection from S/H switches, just to name a few.

Conventional pipeline A/D converter calibration techniques rely on complex algorithms to help mitigate such types of systematic errors but may require substantial area overhead and may be unacceptably time consuming.

SUMMARY

An integrated circuit may include data converter circuitry such as pipeline analog-to-digital (A/D) converter circuitry and associated calibration circuitry. The pipeline A/D converter circuitry may include a plurality of pipeline stages coupled in series. Pipeline stages in a first portion of the pipeline stages may be calibrated using the calibration circuitry and may each have an input operable to receive either a calibration input signal or a voltage residue generated by a preceding pipeline station via an associated multiplexing circuit. A pipeline stage in a second portion of the pipeline stages need not be calibrated by the calibration circuitry. This non-calibrated pipeline station may, for example, be a flash analog-to-digital converting stage.

Each of the pipeline stages in the first portion may include switched capacitor circuitry having sample/hold switches, adjustable capacitive circuits, and an operational amplifier, may include a low resolution analog-to-digital converter, and may include a low resolution digital-to-analog converter coupled in series with the low resolution analog-to-digital converter. The switched capacitor circuitry may be used to provide a predetermined amount of finite gain and may be used simultaneously as a subtraction circuit.

The calibration circuitry may calibrate one pipeline stage at a time. For example, the calibration circuitry may include an analog error correction circuit configured to perform coarse calibration operations with a first degree of calibration accuracy on each of the pipeline stages in the first portion and may include a digital error correction circuit configured to perform fine calibration operations with a second degree of calibration accuracy that is greater than the first degree of calibration accuracy on each of the pipeline stages in the first portion. When calibrating any given pipeline stage, the coarse calibration operations may precede the fine calibration operations.

During calibration, the pipeline A/D converter circuitry may output uncorrected (or uncalibrated) digital codes. The coarse calibration operations may include making adjustments to the finite gain provided by the switched capacitor circuitry in response to comparing the uncorrected digital codes to predetermined digital codes stored on the integrated circuit. The fine calibration operations may include computing code offset values by calculating a difference between the uncorrected digital codes and the predetermined digital codes. Coarse and fine calibration settings may be obtained from each of the pipeline stages in the first portion in this way.

During normal operations, the calibration circuitry may apply the code offset values to uncorrected digital codes generated by the A/D converter circuitry to provide corrected digital codes while the A/D converter circuitry is configured based on the coarse calibration settings (e.g., while the switched capacitor circuitry in each of the calibrated pipeline stages is configured with calibrated gain settings obtained during the coarse calibration operations).

Further features of the present invention, its nature and various advantages will be more apparent from the accompanying drawings and the following detailed description.

DETAILED DESCRIPTION

Embodiments of the present invention relate to integrated circuits with data converters. The integrated circuits may be digital signal processors, microprocessors, application specific integrated circuits (ASICs), programmable logic device integrated circuits (PLDs), or other types of integrated circuits.

Figure 1:
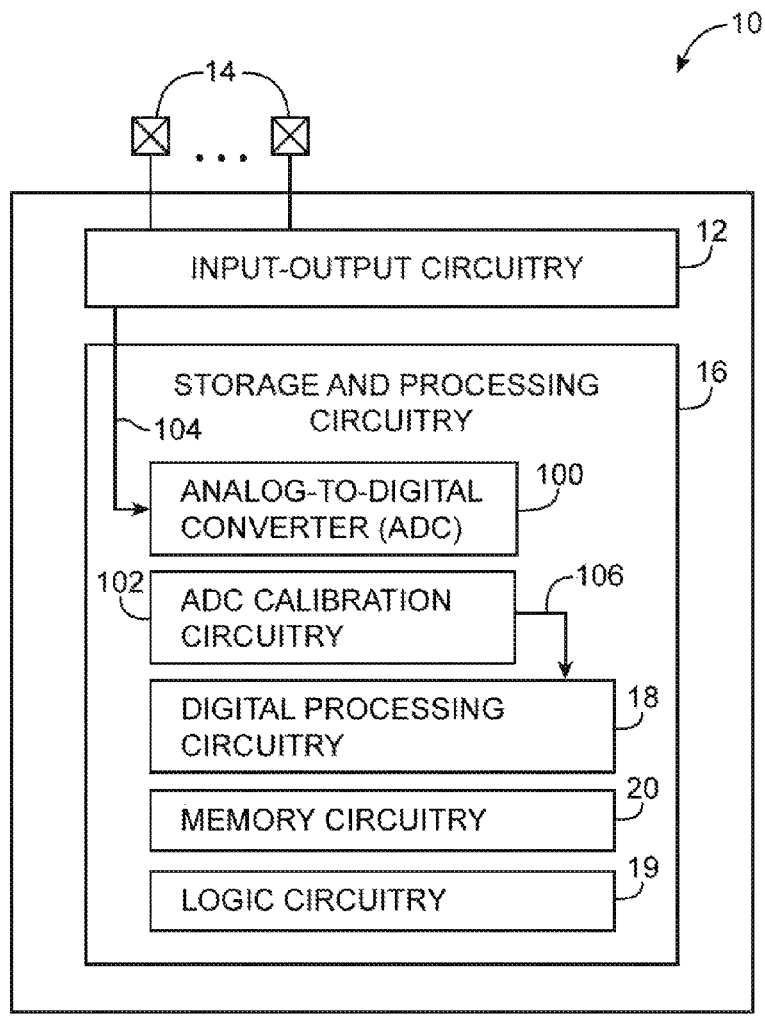
FIG. 1 is a diagram of an illustrative integrated circuit that includes an analog-to-digital (A/D) converter and associated calibration circuitry in accordance with an embodiment of the present invention.

FIG. 1 is a diagram of an integrated circuit 10 that includes input-output (I/O) circuitry 12 and storage and processing circuitry 16. Input-output circuitry 12 may include driver circuits configured to drive signals off of device 10 via input-output pins 14, phase alignment circuits configured to receive signals from other devices via input-output pins 14, electrostatic discharge (ESD) protection circuitry configured to limit the amount of electrostatic current that flows through the input-output pins for preventing damage due to electrostatic discharge events, decoupling capacitor circuitry configured to serve as an energy reserve during dynamic switching operations (e.g., to help provide more stable power supply voltages), and other suitable input-output circuitry.

Storage and processing circuitry 16 may include one or more different types of storage 20 such as nonvolatile memory (e.g., flash memory or other electrically-programmable-read-only memory), volatile memory (e.g., static or dynamic random-access-memory), data registers, and/or other suitable types of memory.

As an example, memory circuitry 20 may be loaded with configuration data for configuring programmable transistors such as pass transistors (sometimes referred to as pass gates or pass gate transistors) in programmable logic circuitry 19. Memory elements 20 that are used for storing configuration data for programmable logic 19 may sometimes be referred to as configuration random-access memory elements (CRAM). Integrated circuit 10 may be configured to implement custom logic functions by configuring programmable logic 19. In such types of arrangements, integrated circuit 10 may sometimes be referred to as a programmable integrated circuit.

Storage and processing circuitry 16 may also include combinatorial logic circuits and sequential logic circuits, digital signal processing modules such as digital processor 18, radio-frequency processing modules (e.g., wireless communications circuitry such as baseband circuits, power amplifiers, low noise amplifiers, filters, etc.), power management circuits, control circuits such as lookup tables, multiplexers, encoders/decoders, counters, adders, multipliers, and other arithmetic logic circuits, etc. Circuitry 16 may also include control circuitry operable to control the interaction among the different circuitry on device 10 and other suitable digital and analog processing circuits.

Storage and processing circuitry 16 may include an analog-to-digital (A/D) converter such as A/D converter 100 (sometimes abbreviated as ADC). A/D converter 100 may serve as an interface between input-output circuitry 12 and digital processing circuitry 18. For example, A/D converter 100 may be configured to receive analog signals provided from off-chip sources via path 104 and to convert the received analog signals into digital signals.

As shown in FIG. 1, A/D converter 100 may be provided with an associated calibration circuitry 102 operable to calibrate converter 100 prior to normal device operation. For example, during calibration operations, calibration circuitry 102 may receive raw (uncorrected) digital signals from converter 100 and may perform appropriate calibration operations on the uncorrected digital signals to obtain calibration settings.

During normal device operation, calibration circuitry 102 may receive uncorrected digital signals from converter 100 and may apply the calibration settings on the uncorrected digital signals to produce calibrated digital signals. Calibrating A/D converter output signals in this way may serve to remove undesired systematic errors associated with operating A/D converter 100. The calibrated digital signals may be fed to digital processing circuitry 18 via path 106 or other destinations within device 10.

Figure 2:
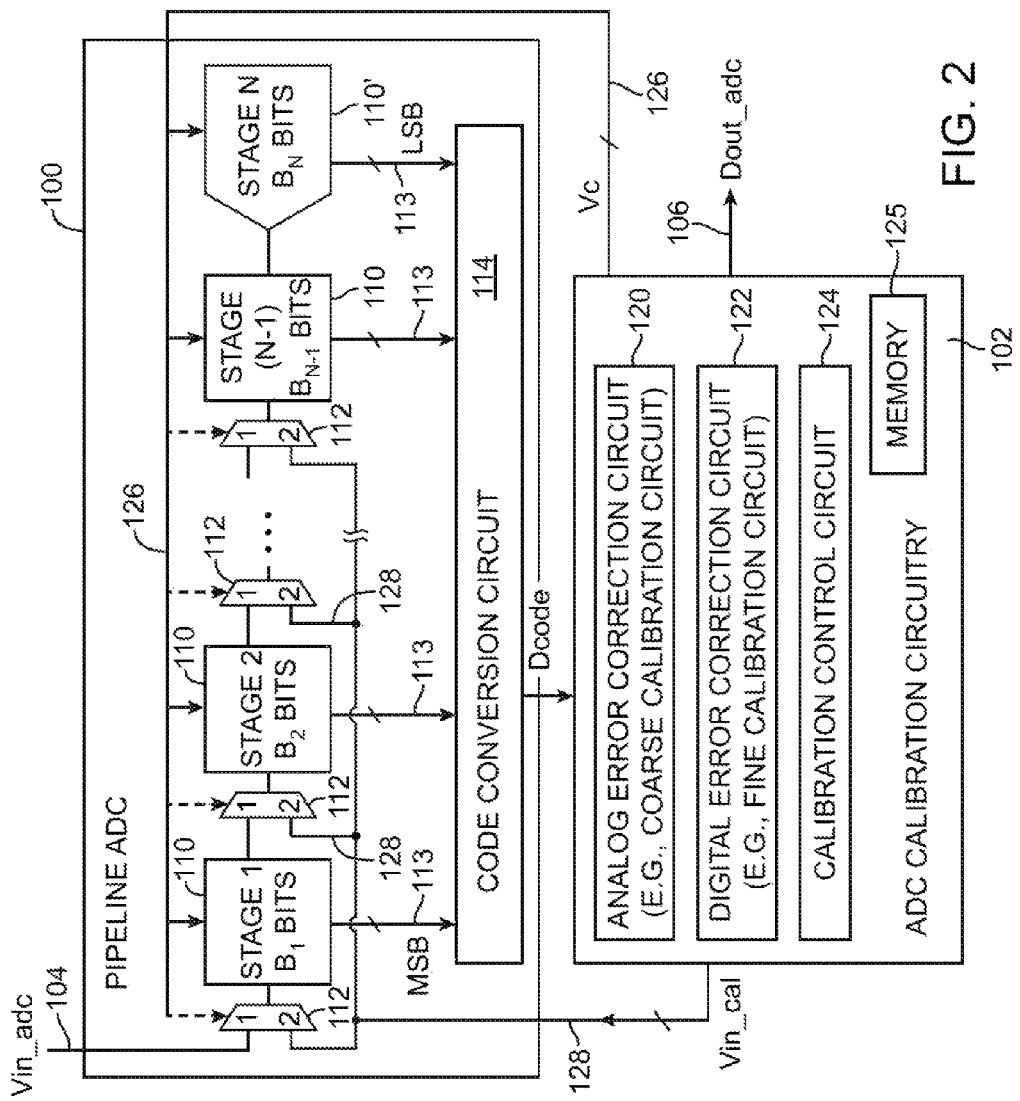
FIG. 2 is a diagram of an illustrative pipeline A/D converter and associated calibration circuitry in accordance with an embodiment of the present invention.

In accordance with an embodiment of the present invention, A/D converter 100 may be a pipeline A/D converter (see, e.g., FIG. 2). Pipeline A/D converter 100 may include multiple pipeline stages such as stages 110 and 110' that are coupled in a series (i.e., in a pipeline configuration). In general, converter 100 may include N stages, each of which may have any suitable degree of quantization accuracy (resolution). As shown in FIG. 2, pipeline A/D converter 100 may include a first $B_1$-bit stage 110, a second $B_2$-bit stage 110, . . . , an $(n-1)^{th}$ $B_{n-1}$-bit stage 110, and an $n^{th}$ $B_n$-bit stage 110', where $B_1$, $B_2$, . . . , $B_{n-1}$, and $B_n$ can each represent any suitable positive integer. The last pipeline stage 110' may be a $B_n$-bit flash A/D converter (as an example). Converter 100 arranged in this configuration may have an overall resolution that is equal to the sum of the resolution of each stage 1 to n (e.g., the overall resolution of converter 100 may be equal to $B_1+B_2+B_3+ \ldots +B_{n-1}+B_n$). For example, a 12-bit pipeline A/D converter 100 may include four 2-bit stages followed by a 4-bit flash stage connected in series. As another example, a 10-bit pipeline A/D converter 100 may include two 3-bit stages and one 4-bit stage cascaded in any desired order.

Each pipeline stage may have an output 113 on which corresponding digital bits are generated. The first pipeline stage 110 may have an input configured to receive an input analog signal Vin_adc (e.g., an analog signal received from input-output circuitry 12 via path 104). The digital bits output from the first stage are commonly referred to as the most significant bits (MSB), whereas the digital bits output from the last stage are commonly referred to as the least significant bits (LSB). The first stage may therefore sometimes be referred to as the MSB stage while the last stage is sometimes referred to as the LSB stage. If desired, each pipeline stage in converter 100 may be implemented based on a flash A/D converter architecture, a single-slope A/D converter architecture, a dual-slope A/D converter architecture, successive approximation A/D converter architecture, pipeline A/D converter architecture, oversampled A/D converter architecture, or other suitable data converter architectures.

Pipeline A/D converter 100 may also include a decoding circuit such as code conversion circuit 114. Code conversion circuit 114 may have inputs configured to receive digital bits from each of the n pipeline stages via respective output paths 113. Code conversion circuit 114 may be used to combine the received digital bits to generate an uncorrected digital code Dcode having a bit width that is equal to the resolution of converter 100. Code conversion circuit 114 may, for example, include shifting circuits and summing circuits that are used to combine the digital bits received from each of the pipeline stages to produce uncorrected Dcode.

The raw uncorrected digital code Dcode may be fed to A/D converter calibration circuitry 102. Circuitry 102 may include an analog error correction circuit (e.g., a circuit for performing coarse calibration on Dcode), a digital error correction circuit (e.g., a circuit for performing fine calibration on Dcode), a calibration control circuit 124 configured to coordinate the operation of error correction circuits 120 and 122 during calibration operations, and memory 125 configured to store calibration settings obtained using error correction circuits 120 and 122.

During normal operation, signal Vin_adc may be received by first stage 110 and resulting signals may be passed from one pipeline stage to the next. During calibration operations, however, it may be desirable to provide a calibration input signal Vin_cal to a selected pipeline stage 110 within converter 100. As shown in FIG. 2, a multiplexing circuit such as multiplexer 112 may be placed at the input of each pipeline stage 110. Multiplexer 112 may include a first input that is coupled to an output associated with a preceding stage, a second input configured to receive Vin_cal from calibration circuitry 102 via path 128, and an output that is coupled to an input of the succeeding stage in the pipeline. Multiplexer 112 that is coupled to the input of the first pipeline stage may have a first input configured to receive Vin_adc via path 104.

Calibration circuitry 102 may control the behavior of stages 110 and 110' and multiplexers 112 by sending control signals Vc via path 126. For example, control circuit 124 may configure each multiplexer 112 to route signals from its first input to its output during normal converter operation but may configure each multiplexer 112 to route signals from its second input to its output during calibration operations.

During calibration, different portions of the pipeline stages may be successively calibrated. For example, consider a scenario in which a 12-bit pipeline A/D converter includes first, second, third, and fourth 2-bit stages 110 and a fifth (last) 4-bit flash A/D stage 110'. Calibration may generally begin near the LSB pipeline stage and proceed towards the MSB pipeline stage. It may not be necessary to calibrate the last stage 110' if flash A/D stage 110' exhibits sufficient accuracy.

During first calibration operations, Vin_cal may be fed to multiplexer 112 coupled to the input of the fourth stage 110 to calibrate the fourth pipeline stage 110 (e.g., to obtain a first set of calibration settings). When the fourth stage 110 has been calibrated, second calibration operations can be performed. During the second calibration operations, Vin_cal may be fed to multiplexer 112 coupled to the input of the third stage 110 to calibrate the third pipeline stage 110 (e.g., to obtain a second set of calibration settings). When the third stage 110 has been calibrated, third calibration operations can be performed. During the third calibration operations, Vin_cal may be fed to multiplexer 112 coupled to the input of the second stage 110 to calibrate the second pipeline stage 110 (e.g., to obtain a third set of calibration settings). When the second stage 110 has been calibrated, fourth calibration operations can be performed. During the fourth calibration operations, Vin_cal may be fed to multiplexer 112 coupled to the input of the first stage 110 to calibrate the first pipeline stage 110 (e.g., to obtain a fourth set of calibration settings).

While calibrating a particular pipeline stage 110, analog error correction circuit 120 may first be used to perform coarse calibration adjustments (e.g., adjustments that modify the actual hardware configuration within that pipeline stage). After sufficient coarse calibration adjustments have been made, digital error correction circuit 122 may then be used to perform fine calibration adjustments (e.g., code error adjustments in the digital/software domain by adding or subtracting appropriate offset values to uncorrected/uncalibrated codes Dcode without reconfiguring the actual hardware). The coarse calibration adjustments may provide a first degree of calibration accuracy, whereas the fine calibration adjustments may provide second degree of calibration accuracy that is higher than the first degree of calibration accuracy.

Calibration control circuit 124 may then compute optimized calibration settings based on the calibration settings obtained from each of pipeline stages 110 (e.g., based on the first, second, third, and fourth sets of calibration settings). The optimized calibration settings may be stored in memory 125. During normal operation, the optimized calibration settings may then be applied to the uncalibrated digital code Dcode to produce corrected (or calibrated) digital output code Dout_adc on output 106.

Figure 3:
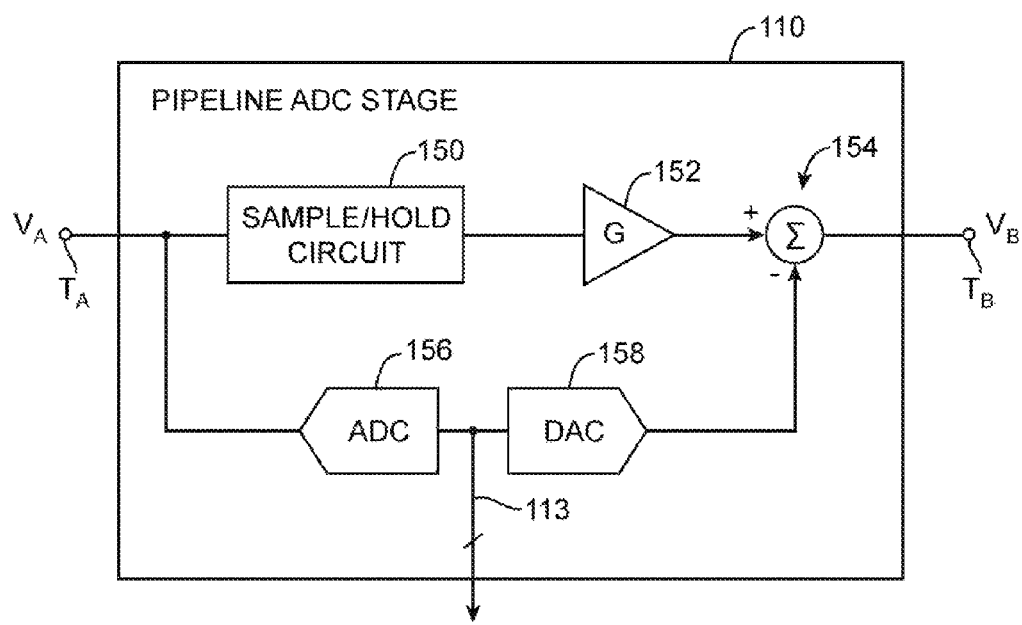
FIG. 3 is a diagram of an illustrative A/D converter pipeline stage in accordance with an embodiment of the present invention.

FIG. 3 is a diagram of a pipeline stage 110 having an input terminal $T_A$ (i.e., a terminal configured to receive stage input voltage signal $V_A$) and an output terminal $T_B$ (i.e., a terminal on which stage output voltage signal $V_B$ is provided). As shown in FIG. 3, stage 110 may include a sample-and-hold (S/H) circuit 150, a finite gain operational amplifier 152, an arithmetic circuit 154, a low resolution A/D converter 156, and low resolution digital-to-analog converter 158. Circuit 150 may be used to sample input voltage signal $V_A$ that is presented at terminal $T_A$, may hold the sampled voltage signal, and may present the held voltage signal to amplifier 152 for amplification.

Input voltage signal $V_A$ may be converted into corresponding digital bits using low resolution A/D converter 156. These digital bits may be fed to code conversion circuit 114 via path 113 and may also be fed to an input of low resolution D/A converter 158. Converter 158 may be used to convert the digital bits into its analog equivalent.

The arithmetic circuit 154 may have a first input operable to receive the amplified voltage signal from amplifier 152 and a second input operable to receive the converted voltage presented at the output of D/A converter 158. Arithmetic circuit 154 may, for example, be a subtraction circuit configured to compute a difference output by subtracting the value received at its second input from the value received at its first input. In the example of FIG. 3, subtractor 154 may be configured to output a difference voltage that is equal to the amplified voltage signal produced at the output of amplifier 152 minus the converted voltage signal produced at the output of low resolution D/A converter 158. A difference voltage computed in this way represents an amount by which the input voltage signal at the current pipeline stage deviates from a predetermined voltage comparison threshold associated with low resolution A/D converter 156 and may sometimes be referred to as a residue voltage.

The pipeline stage 110 of FIG. 3 is merely illustrative and does not serve to limit the scope of the present invention. If desired, the gain stage (i.e., finite gain operational amplifier 152) may be placed at the output of arithmetic circuit 154, S/H circuit 150 may be implemented using metal-oxide-semiconductor field-effect transistors, capacitors, amplifying circuits, and other suitable electrical components, and the gain stage may provide a gain of at least 2, at least 4, at least 8, etc.

Figure 4:
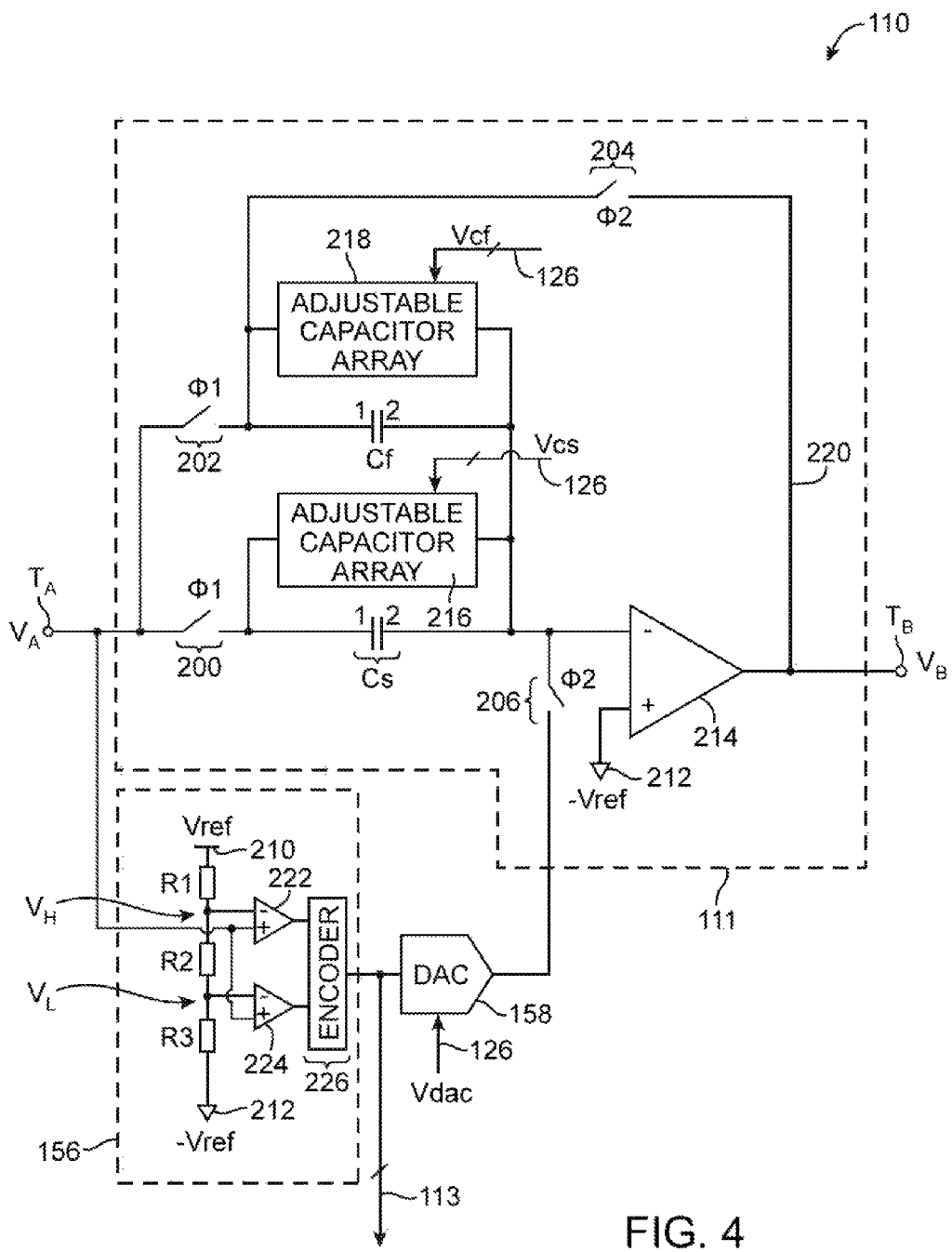
FIG. 4 is a circuit diagram of an illustrative A/D converter pipeline stage implemented using a switched capacitor configuration in accordance with an embodiment of the present invention.

In one suitable arrangement, pipeline stage 110 of FIG. 3 may be implemented using a switched capacitor configuration in which the functionalities of S/H circuit 150, gain circuit 152, and subtraction circuit 154 are merged together (see, e.g., FIG. 4). As shown in FIG. 4, switched capacitor circuitry 111 may include an operational amplifier 214, a first switch 200, a second switch 202, a third switch 204, a fourth switch 206, an input (sampling) capacitor Cs, a feedback capacitor Cf, a first adjustable capacitor array 216, and a second adjustable capacitor array 218.

Operational amplifier 214 may have a first (positive) input that is coupled to negative power supply terminal 212 (e.g., a power supply terminal on which negative power supply voltage −Vref is provided), a second (negative) input, and an output that serves as output terminal $T_B$ for pipeline stage 110. Capacitor Cs may have a first terminal that is coupled to stage input $T_A$ via switch 200 and a second terminal that is coupled to the second input of amplifier 214.

Adjustable capacitor array 216 may be coupled in parallel with capacitor Cs and may be adjusted using control signals Vcs that are provided over path 126 from analog error correction circuit 120 (see, e.g., FIG. 2). Capacitor Cf may have a first terminal that is coupled to stage input $T_A$ via switch 202 and a second terminal that is coupled to the second input of amplifier 214. Adjustable capacitor array 218 may be coupled in parallel with capacitor Cf and may be adjusted using control signals Vcf that are provided over path 126 from error correction circuit 120. Switch 204 may be coupled between the first terminal of capacitor Cf and the output of amplifier 214. The second input of amplifier 214 may also be coupled to the output of low resolution D/A converter 158 via switch 206.

Switches 200, 202, 204 and 206 may, for example, be controlled using clock signals. In particular, switches 200 and 202 may be turned on during a first phase of the clock signals (while switches 204 and 206 remain in the off state), whereas switches 204 and 206 may be turned on during a second phase of the clock signals (while switches 200 and 202 are deactivated).

Arranged and operated in this way, switched capacitor circuitry 111 may provide a gain that is approximately equal to one plus the capacitance of Cs divided by the capacitance of Cf (e.g., G=1+Cs/Cf). In a scenario in which the capacitances of Cs and Cf are equal, the gain of switched capacitor circuitry 111 may therefore be equal to 2. Adjustable capacitor arrays 216 and 218 may be tuned to adjust the gain of switched capacitor circuitry 11. For example, increasing the capacitance of array 218 effectively increases the feedback capacitance and may therefore result in a gain reduction. As another example, increasing the capacitance of array 216 effectively increases the input capacitance and may therefore result in a gain increase.

Figure 5:
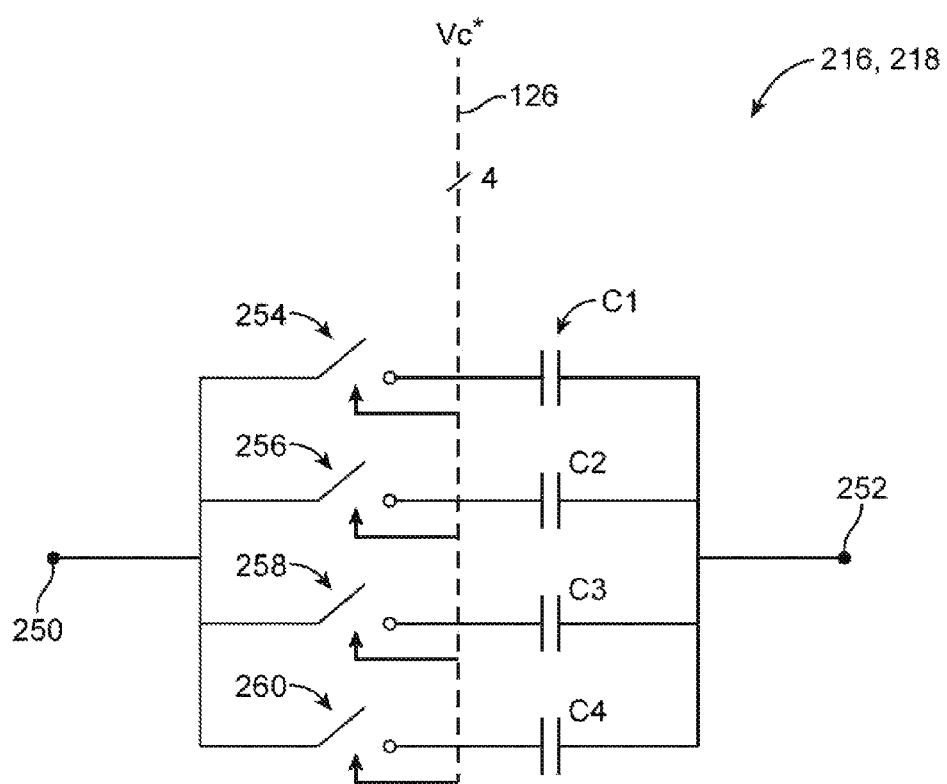
FIG. 5 is a diagram of an adjustable capacitive circuit in accordance with an embodiment of the present invention.

Adjustable capacitor array 216 may include an array of capacitors such as capacitors C1-C4 and associated switches (e.g., switches 254, 256, 258, and 260) for selectively switching one or more of the capacitors into place between adjustable capacitor terminals 250 and 252 (see, e.g., FIG. 5). The states of the switches may be controlled by control signals Vc* from error correction circuit 120 in calibration circuitry 102. Capacitors C1-C4 may be selectively coupled in parallel between terminals 250 and 252 as shown in FIG. 5. As an example, switch 254 may be activated to switch capacitor C1 into use while switch 256 may be deactivated to switch capacitor C2 out of use. Other configurations for adjustable capacitor 216 may be used, if desired. For example, configurations in which capacitors are connected in series and are provide with switch-based selective bypass paths may be used, configurations with combinations of parallel and series-connected capacitors may be used, etc. If desired, adjustable capacitor array 218 may be formed in a similar circuit arrangement.

In the example of FIG. 4, low resolution A/D converter 156 may be implemented using a flash A/D converter architecture. If desired, low resolution A/D converter 156 may be implemented using other types of A/D converter architectures. As shown in FIG. 4, flash A/D converter 156 may include a resistive ladder coupled between positive power supply terminal 210 (e.g., a power supply terminal on which positive power supply reference voltage Vref is provided) and negative power supply terminal 212, multiple comparator circuits (e.g., comparators 222 and 224), and an encoding circuit 226. The resistive ladder may, for example, include resistive circuits R1, R2, and R3 (e.g., resistors) coupled in series between power supply terminals 210 and 212. Resistors R1 and R2 may be connected at a common node on which intermediate reference voltage $V_H$ is provided, whereas resistors R2 and R3 may be connected at a common node on which intermediate reference voltage $V_L$ is provided. Intermediate reference voltage $V_H$ may be greater than $V_L$. Reference voltages $V_H$ and $V_L$ may sometimes be referred to as threshold reference levels or voltage comparison levels.

Comparator 222 may have a first (positive) input operable to receive input voltage $V_A$ from terminal $T_A$, a second (negative) input operable to receive first comparison voltage $V_H$, and an output that is coupled to encoder 226. Comparator 224 may have a first (positive) input operable to receive input voltage $V_A$ from terminal $T_A$, a second (negative) input operable to receive second comparison voltage $V_L$, and an output that is coupled to encoder 226. Comparators 222 and 224 may be used to determine whether the voltage level at its first input is greater than or less than the voltage level at its second input.

The output signals generated by the comparators in flash A/D converter 156 may represent an output pattern commonly referred to as a thermometer code representation. Encoder 226 may be used to convert thermometer code based signals into other numerical representations such as binary-code based signals, gray-code based signals, or other signals with other encoding schemes. Encoder 226 may, for example, be used to generate binary digital bits based on the output values of comparators 222 and 224. Digital bits generated in this way may be fed to code conversion circuit 114 via path 113 and may fed converted back into its analog equivalent using low resolution D/A converter 158. Low resolution D/A converter 158 may be a simple resistor string D/A converter, a charge redistribution D/A converter, a current-based R-2R ladder D/A converter, or other types of D/A converting circuits.

The circuit diagram as shown in FIG. 4 is merely illustrative and does not serve to limit the scope of the present invention. If desired, switch capacitor circuitry 111 and low resolution converters 156 and 158 may support single-ended signaling or differential signaling, circuitry 111 may provide any desired amount of gain, low resolution converters 156 and 158 may provide at least one voltage comparison level, at least two voltage comparison level, at least three voltage comparison level, etc.

Figure 6:
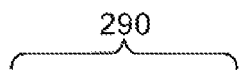
FIG. 6 is a table showing illustrative output values for a 1.5-bit pipeline stage in accordance with an embodiment of the present invention.

FIG. 6 is a table showing illustrative output values associated with operating A/D pipeline converter stage 110 of FIG.

4. As shown in FIG. 4, a stage input voltage $V_A$ that is greater than comparison voltage $V_H$ may correspond to a "high" (H) input range and may generate digital bits "10" at the input of low resolution D/A converter 158. A stage input voltage $V_A$ that is less than $V_H$ but greater than comparison voltage $V_L$ may correspond to a "medium" (M) input range and may generate digital bits "01" at the input of low resolution D/A converter 158. A stage input voltage $V_A$ that is less than $V_L$ may correspond to a "low" (L) input range and may generate digital bits "00" at the input of low resolution D/A converter 158. Low resolution D/A converter 158 may be configured to generate at its output positive power supply voltage +Vref in response to receiving bits "10" at its input, a ground voltage (e.g., zero volts) in response to receiving bits "01" at its input, and negative power supply voltage −Vref in response to receiving bits "00" at its input (see, column 290).

Switched capacitor circuitry 111 may be configured to subtract the voltage signal generated at the output of D/A converter 158 from an amplified version of stage input signal $V_A$. The example of FIG. 6 assumes a switched capacitor gain of 2. When $V_A$ is in range H, stage output signal $V_B$ may therefore be equal to the difference between the amplified version of $V_A$ and +Vref (e.g., $V_B = 2*V_A − Vref$). When $V_A$ is in range M, stage output signal $V_B$ may be equal to the difference between the amplified version of $V_A$ and ground (e.g., $V_B = 2*V_A − 0$). When $V_A$ is in range L, stage output signal $V_B$ may be equal to the difference between the amplified version of $V_A$ and −Vref (e.g., $V_B = 2*V_A + Vref$).

Figure 7:
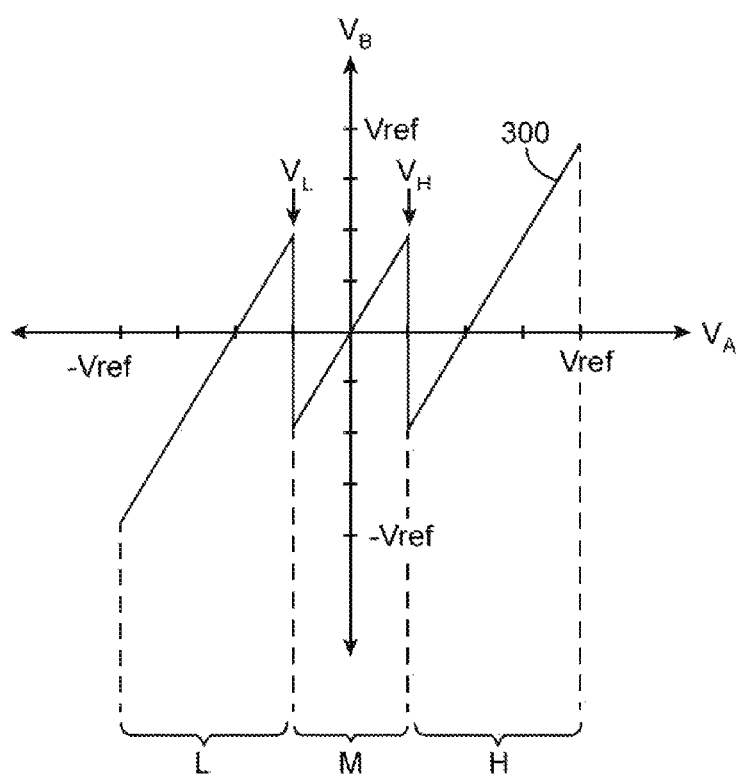
FIG. 7 is a plot of output voltage versus input voltage for a 1.5-bit pipeline stage in accordance with an embodiment of the present invention.

FIG. 7 is a graph plotting stage output voltage $V_B$ versus stage input voltage $V_A$. Line 300 of FIG. 7 may have a slope of that is equal to the gain provided by switched capacitor circuitry 111 (e.g., the slope of line 300 is equal to 2). In the example of FIG. 7, $V_L$ is equal to −Vref/4, whereas $V_H$ is equal to +Vref/4. Line 300 may be segmented into three separate portions each of which corresponds to one of ranges L, M, and H. In portion L of line 300, $V_B$ may range from −Vref (when $V_A$ is equal to −Vref) to +Vref/2 (when $V_A$ is equal to $V_L$). In portion M of line 300, $V_B$ may range from −Vref/2 (when $V_A$ is equal to $V_L$) to +Vref/2 (when $V_A$ is equal to $V_H$). In portion H of line 300, $V_B$ may range from −Vref/2 (when $V_A$ is equal to $V_H$) to +Vref (when $V_A$ is equal to +Vref).

In general, a pipeline stage having a single comparison level (i.e., a comparison level that is centered between −Vref and +Vref at zero volts) and two resulting line segments may be referred to as a 1-bit pipeline stage. A pipeline stage having three comparison levels (i.e., comparison levels at −Vref/2, zero volts, and +Vref/2) and four resulting line segments may be referred to as a 2-bit pipeline stage. A pipeline stage having only two comparison levels (as shown in FIGS. 4, 6, and 7) and three resulting line segments may therefore sometimes be referred to as a 1.5-bit pipeline stage.

This example in which $V_L$ is equal to −Vref/4 and $V_H$ is equal to +Vref/4 is merely illustrative. If desired, $V_L$ and $V_H$ may be any suitable fraction of −Vref and +Vref, respectively. As another example, $V_L$ may be equal to −Vref/3 while $V_H$ may be equal to +Vref/3. As another example, $V_L$ may be equal to −Vref/2 while $V_H$ may be equal to +Vref/2.

Figure 8:
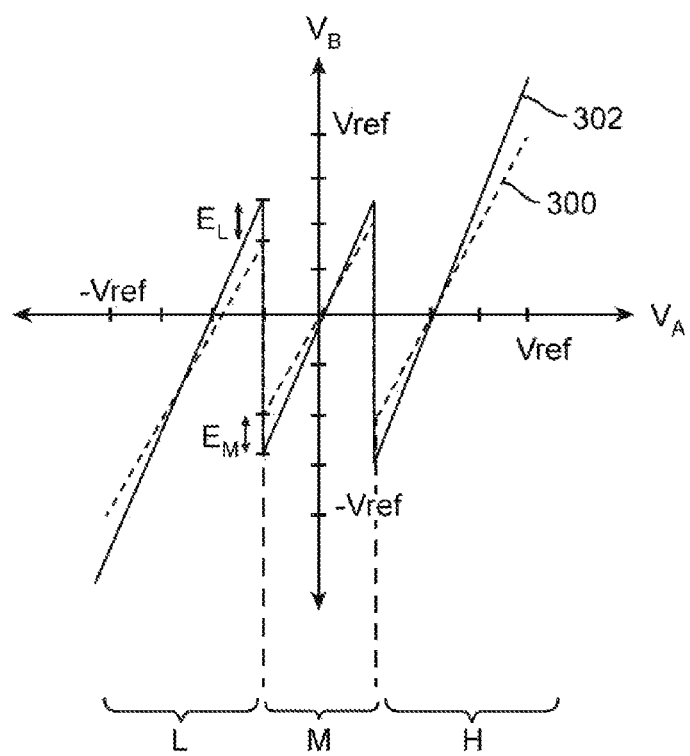
FIG. 8 is a plot illustrating amplifier gain error associated with the 1.5-bit pipeline stage of FIG. 7 in accordance with an embodiment of the present invention.

Line 300 of FIG. 7 represents the ideal input-output relationship for pipeline stage 110. In practice, however, stage 110 may suffer from gain error (as a result of mismatch between the input capacitance and feed capacitance), comparator offset, and other systematic errors. These errors can cause deviations from line 300. FIG. 8 is a plot illustrating a line 302 resulting from gain error. FIG. 8 shows a positive gain error (e.g., an error in gain that causes the actual gain to be greater than the desired gain), which causes line 302 to have a slope that is greater than line 300. When $V_A$ is equal to $V_L$, a gain error $\epsilon_L$ may be observed when the output of D/A converter 158 is equal to −Vref (in range L), whereas a gain error $\epsilon_M$ may be observed when the output of D/A converter 158 is equal to zero volts (in range M).

In contrast to gain error, comparator offset may undesirably cause line 300 to shift right or left from the ideal position. Other types of systematic errors may result in other undesired changes to the ideal characteristic line 300. To mitigate these errors, it may therefore be desirable to provide ways for calibrating at least some of stages 110 in pipeline A/D converter 100 using circuitry such as calibration circuitry 102 (FIG. 2).

Calibration circuitry 102 may be configured to perform calibration one pipeline stage at a time, starting from one of the LSB stages and proceeding towards the MSB stage. When calibrating a particular pipeline stage, analog error correction circuit 120 may first be used to perform coarse calibration, followed by fine calibration performed using digital error correction circuit 122.

Figure 9:
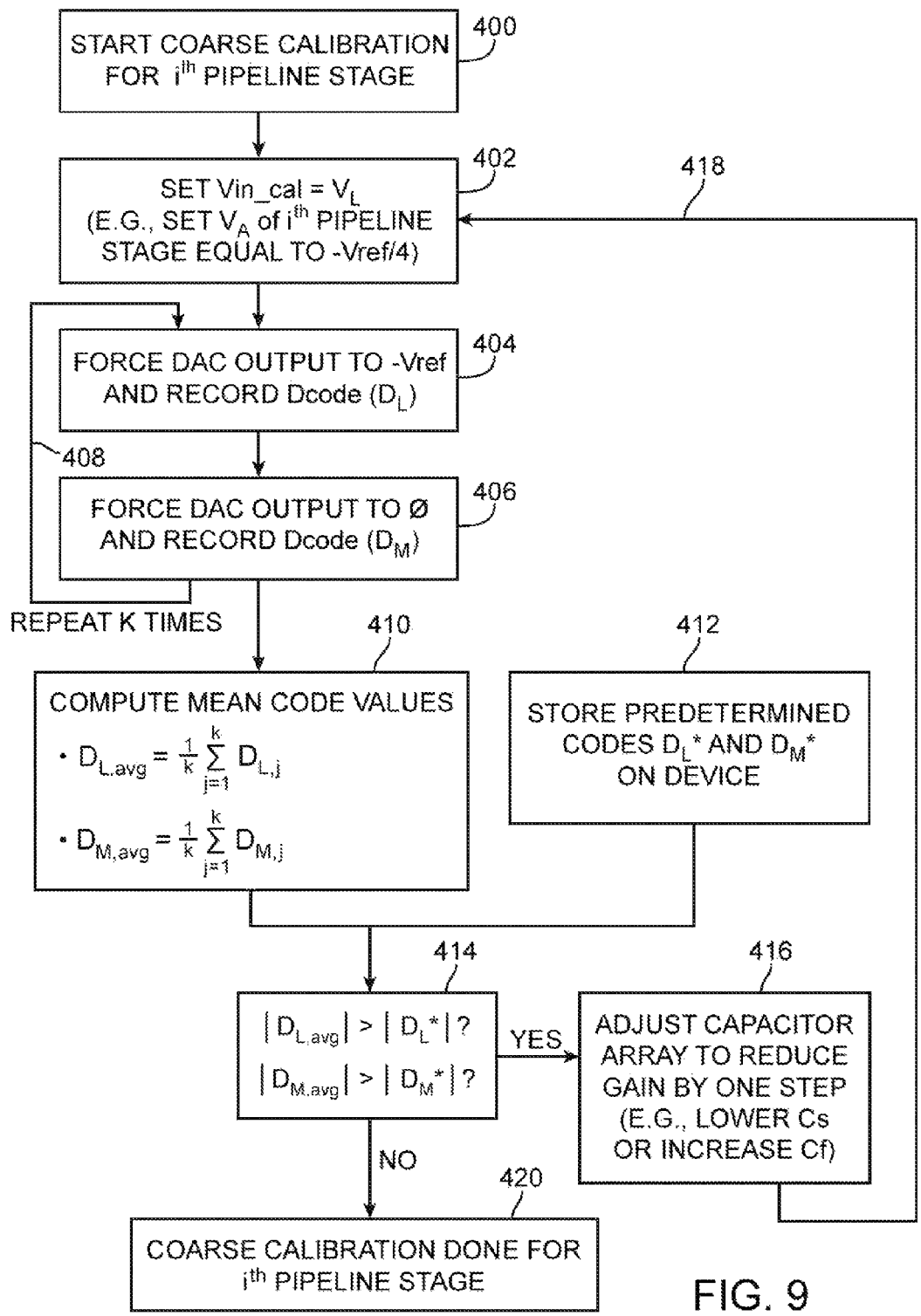
FIG. 9 is a flow chart of illustrative steps for performing coarse (analog) calibration on an A/D converter pipeline stage in accordance with an embodiment of the present invention.

FIG. 9 shows illustrative steps involved in performing coarse calibration on a pipeline stage 110. At step 400, a given pipeline stage 110 (sometimes referred to herein as the $i^{th}$ pipeline stage) may be selected for coarse calibration. At step 402, the selected pipeline stage may be configured to receive calibration input signal Vin_cal having a predetermined value that is equal to intermediate threshold voltage $V_L$ (e.g., the selected pipeline stage may receive at its input −Vref/4).

At step 404, control circuit 124 may configure low resolution D/A converter 158 to output −Vref (see, e.g., FIG. 4, by sending appropriate control signals Vdac to converter 158 via path 126). Analog error correction circuit 120 may receive a corresponding uncorrected Dcode (referred to herein as $D_L$) that includes digital bits generated from the selected pipeline stage and additional stages following the selected stage in the pipeline (if any).

At step 406, control circuit 124 may configure low resolution D/A converter 158 to output zero volts (e.g., by sending appropriate control signals Vdac to converter 158 via path 126). Error correction circuit 120 may receive a corresponding uncalibrated Dcode (referred to herein as $D_M$) that includes digital bits generated from the selected pipeline stage and additional stages following the selected stage in the pipeline (if any). Steps 404 and 406 may be repeated k times to obtain k samples of $D_L$ and $D_M$ (as indicated by path 408). For example, at least three samples may be obtained, at least ten samples may be obtained, at least 100 samples may be obtained, etc.

At step 410, error correction circuit 120 may be used to compute mean code values based on the results gathered during steps 404 and 406. For example, an L range digital average $D_{L,avg}$ may be obtained by computing the mean of the k $D_L$ samples and/or a M range digital average $D_{M,avg}$ may be obtained by computing the mean of the k $D_M$ samples.

Predetermined codes such as codes $D_L^*$ and $D_M^*$ may be stored within memory 125 (step 412). Digital codes $D_L^*$ and $D_M^*$ represent ideal digital codes that should be output by converter 100 in response to receiving Vin_cal and if the output of D/A converter 158 is set to −Vref and zero volts, respectively. Step 412 may be performed prior to calibration operations or prior to normal device operation. For example, step 412 may be performed during manufacturing operations by burning the ideal digital codes into non-volatile memory on device 10.

At step 414, the computed mean codes $D_{L,avg}$ and $D_{M,avg}$ may be compared to the ideal digital codes $D_L^*$ and $D_M^*$, respectively. If the magnitude of the mean codes exceeds the magnitude of the ideal codes, processing may proceed to step 416.

At step 416, the gain of switched capacitor circuitry 111 may be changed by adjusting at least one of capacitor arrays 216 and 218 (e.g., by sending appropriate control signals Vcs and Vcf to arrays 216 and 218, respectively). As an example, the gain of circuitry 111 may be reduced by adjusting array 218 to increase the effective feedback capacitance or by adjusting array 216 to decrease the effective input capacitance. As another example, the gain of circuitry 111 may be increased by adjusting array 218 to decrease the effective feedback capacitance or by adjusting array 216 to increase the effective input capacitance.

In the example of FIG. 9, step 416 serves to monotonically decrease the gain of circuitry 111 until the mean codes no longer exceed the ideal codes. It may therefore be desirable to initially configure arrays 216 and 218 in a way such that the gain of circuitry 111 is maximized to guarantee convergence (e.g., to guarantee that the actual gain of the $i^{th}$ stage is initially greater than the ideal gain). When the mean codes are less than the ideal codes, coarse calibration for the currently selected pipeline stage is complete (step 420). At step 420, the gain of the $i^{th}$ pipeline stage should be relatively close to the desired (ideal) gain. The current coarse calibration settings for the $i^{th}$ pipeline stage may be stored in memory 125. Performing coarse calibration in this way can therefore help reduce gain error and mitigate capacitor mismatch.

Figure 10:
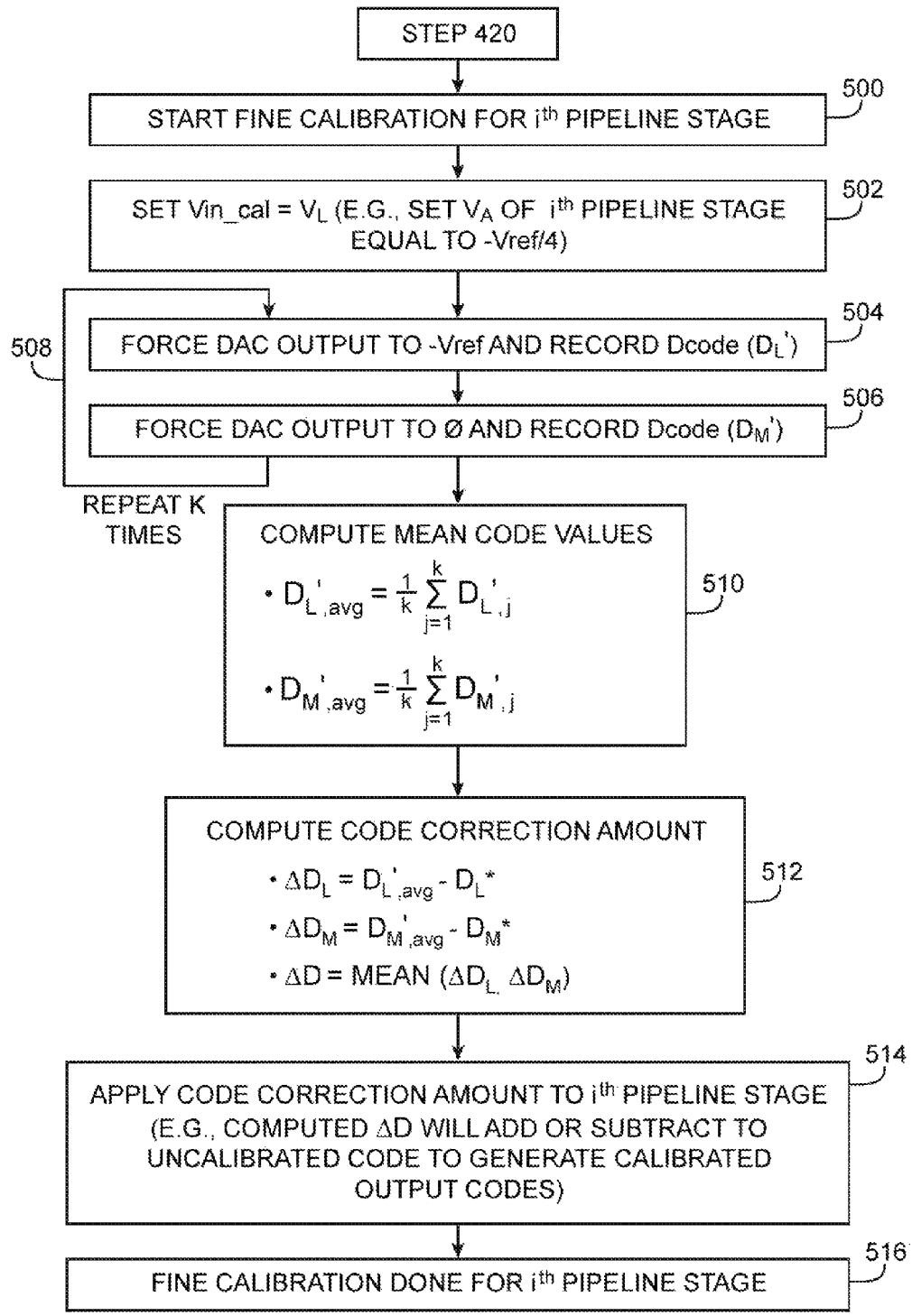
FIG. 10 is a flow chart of illustrative steps for performing fine (digital) calibration on an A/D converter pipeline stage in accordance with an embodiment of the present invention.

FIG. 10 shows illustrative fine calibration steps that can be performed after the coarse calibration steps. Fine calibration may be performed on the currently selected pipeline stage (at step 500, directly following step 420).

At step 502, the selected pipeline stage may be configured to receive calibration input signal Vin_cal having a predetermined value that is equal to intermediate threshold voltage $V_L$ (e.g., the selected pipeline stage may receive at its input −Vref/4).

At step 504, control circuit 124 may configure low resolution D/A converter 158 to output −Vref. Digital error correction circuit 122 may receive a corresponding Dcode (referred to herein as $D_L'$) that includes digital bits generated from the selected pipeline stage and additional stages following the selected stage in the pipeline (if any).

At step 506, control circuit 124 may configure low resolution D/A converter 158 to output zero volts. Circuit 122 may receive a corresponding Dcode (referred to herein as $D_M'$) that includes digital bits generated from the selected pipeline stage and additional stages following the selected stage in the pipeline (if any). Steps 504 and 506 may be repeated k times to obtain k samples of $D_L'$ and $D_M'$ (as indicated by path 508). In general, at least five samples or other suitable number of samples may be obtained so that non-systematic errors such as jitter is removed.

At step 510, digital error correction circuit 122 may be used to compute mean code values based on the results gathered from stages 504 and 506. For example, an L range digital average $D_{L',avg}$ may be obtained by computing the mean of the k $D_L'$ samples and/or a M range digital average $D_{M',avg}$ may be obtained by computing the mean of the k $D_M'$ samples.

At step 512, calibration control circuit 124 may compute a first code offset $\Delta D_L$ by taking the difference between $D_{L',avg}$ and $D_L^*$ (e.g., $\Delta D_L$ may be equal to $D_{L',avg}$ minus $D_L^*$) and a second code offset $\Delta D_M$ by taking the difference between $D_{M',avg}$ and $D_M^*$ (e.g., $\Delta D_M$ may be equal to $D_{M',avg}$ minus $D_M^*$). An average code offset value $\Delta D$ may then be computed by taking the mean of first code offset $\Delta D_L$ and second code offset $\Delta D_M$.

At step 514, the computed average code offset AD may be applied to the $i^{th}$ pipeline stage. The computed code offset associated with the $i^{th}$ pipeline stage (i.e., $\Delta D_i$) may be stored in memory 125. Once the average code offset $\Delta D_i$ for the $i^{th}$ pipeline stage has been computed and stored, fine calibration for that pipeline stage is complete (step 516). Performing fine calibration in this way can help reduce other remaining sources of systematic errors such as comparator offset, inaccuracies in reference power supply voltages, and charge injection from the sample/hold switches (e.g., switches 200, 202, 204, and 206), just to name a few.

The calibration steps of FIGS. 9 and 10 in which Vin_cal is set to a $V_L$ of −Vref/4 and in which the output of low resolution D/A converter 158 is forced to either −Vref or zero volts is merely illustrative and does not serve to limit the scope of the present invention. If desired, $V_L$ may be another suitable voltage level, Vin_cal may be set to $V_H$ or other threshold reference voltage levels, low resolution D/A converter 158 may be forced to output other desired voltages depending on Vin_cal, etc.

Figure 11:
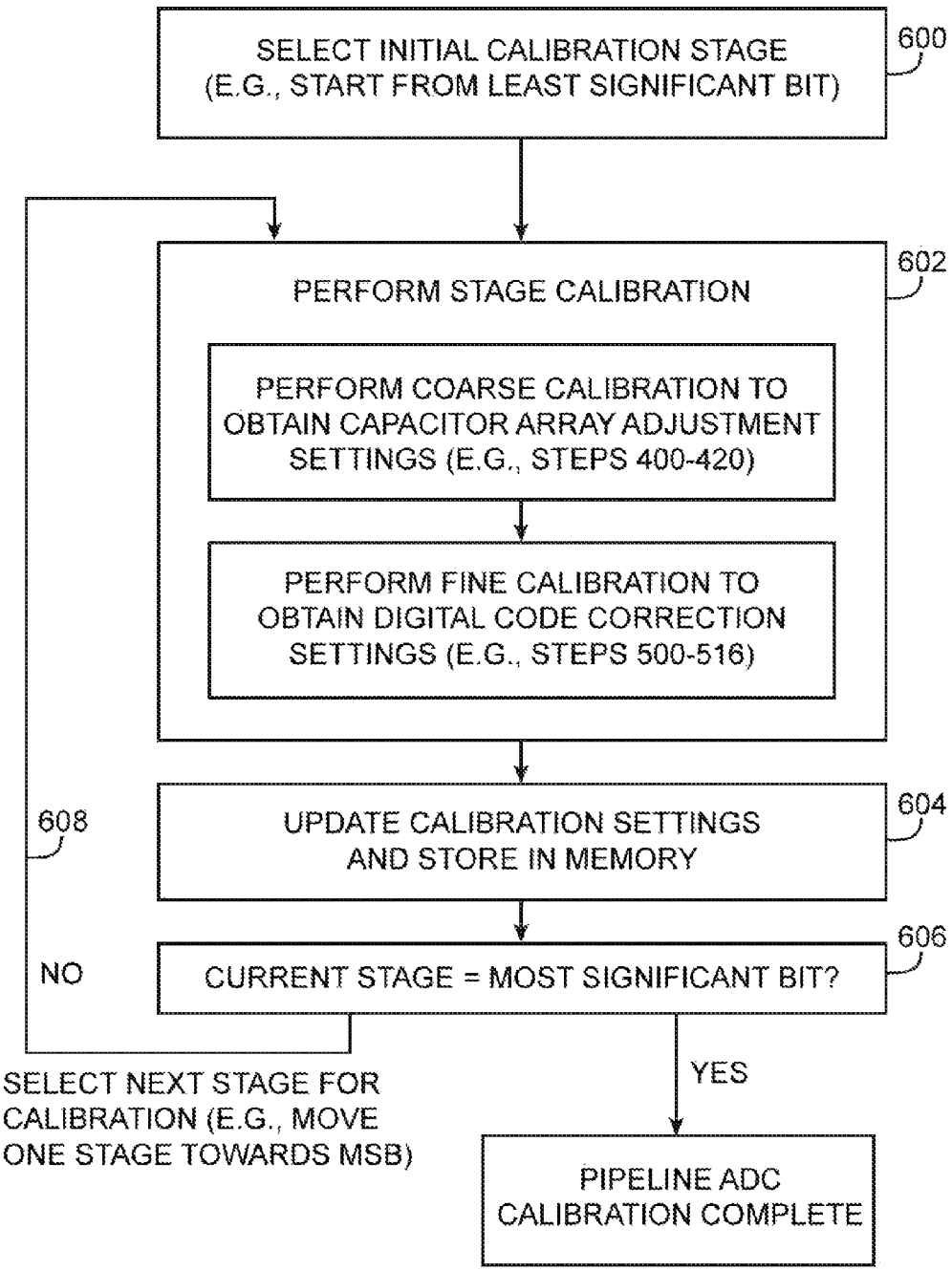
FIG. 11 is a flow chart of illustrative steps for calibrating a pipeline A/D converter in accordance with an embodiment of the present invention.

FIG. 11 summarizes illustrative steps that can be used to calibrate pipeline A/D converter 100. At step 600, a given pipeline stage may be selected for initial calibration. For example, consider a scenario in which converter includes four 1.5-bit pipeline stages 110 followed by a 3-bit flash converting stage 110'. In this example, the last 1.5-bit pipeline stage 110 may be selected as the initial stage for calibration. If desired, the 3-bit flash converting stage 110' may be selected as the initial stage for calibration. If desired, the second to last pipeline stage 110 may be selected as the initial stage for calibration. In general, calibration may begin at one of the LSB pipeline stages and proceed towards the first (MSB) stage.

At step 602, calibration operations may be performed on the currently selected stage. In particular, coarse calibration operations may be performed using analog error correction circuit 120 (e.g., steps 400-420 in FIG. 9), and fine calibration operations may be performed using digital error correction circuit 122 (e.g., steps 500-516 in FIG. 10). The fine calibration operations may be performed after the coarse calibration operations.

At step 604, calibration settings may be updated based on the calibration settings obtained during step 602 (e.g., coarse calibration settings for configuring the gain of switched capacitor circuitry 111 and fine calibration settings for altering the uncorrected digital code Dcode). The coarse calibration settings may only affect the physical (hardware) configuration of the currently selected pipeline stages, whereas the fine calibration settings may take into account the fine calibration settings associated with any previously calibrated stages. The updated calibration settings may be stored in memory 125.

At step 606, control circuit 124 may check whether the currently selected pipeline stage is the leading (first) MSB stage. If the currently selected stage is not the leading MSB stage, a new pipeline stage preceding the currently selected stage may be selected for calibration (e.g., by moving one stage towards the MSB stage), as indicated by path 608. If the currently selected is the leading MSB stage, calibration for pipeline A/D converter 100 is complete. Thereafter, converter 100 may be placed in normal operation using the most updated calibration settings that include coarse calibration settings for each of the calibrated pipeline stages 110 and fine calibration settings computed based on code offset values $\Delta D$ obtained from each of the calibrated pipeline stages 110. Calibration operations that is based on both coarse (analog)

and fine (digital) error correction may be capable of calibrating converter 100 up to a satisfactory level of accuracy within a tolerable amount of time.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for calibrating a data converter on an integrated circuit, comprising:
with calibration circuitry, performing analog calibration operations on the data converter, wherein the data converter includes a plurality of pipeline analog-to-digital converter stages each of which includes a variable gain amplifier having an adjustable gain, and wherein the calibration circuitry adjusts the gain of the variable gain amplifier while performing the analog calibration operations; and
with the calibration circuitry, performing digital calibration operations on the data converter, wherein performing the analog calibration operations on the data converter comprises performing coarse calibration on the data converter with a first degree of accuracy, and wherein performing the digital calibration operations on the data converter comprises performing fine calibration on the data converter with a second degree of accuracy that is greater than the first degree to accuracy.

2. The method defined in claim 1, wherein the fine calibration operations are performed after the coarse calibration operations.

3. The method defined in claim 1, wherein the plurality of pipeline analog-to-digital converter stages are connected in series, and wherein performing the analog and digital calibration operations comprises initially performing the analog and digital calibration operations on a selected pipeline analog-to-digital converter stage other than a last pipeline analog-to-digital converter stage in the plurality of series-connected pipeline analog-to-digital converter stages.

4. The method defined in claim 1, wherein the plurality of pipeline analog-to-digital converter stages are connected in series, and wherein performing the analog and digital calibration operations comprises:
performing the analog and digital calibration operations on a first analog-to-digital converter pipeline stage in the plurality of series-connected pipeline analog-to-digital converter stages during a first time period; and
performing the analog and digital calibration operations on a second pipeline analog-to-digital converter stage in the plurality of series-connected pipeline analog-to-digital converter stage that precedes in the first pipeline stage during a second time period after the first time period.

5. The method defined in claim 1, wherein performing the digital calibration operations on the data converter comprises obtaining code offset values, the method further comprising:
during normal operation, generating uncorrected codes with the data converter; and
with the calibration circuitry, receiving the uncorrected codes from the data converter and generating corresponding corrected codes by applying the code offset values to the uncorrected codes while the gain of the at least one pipeline analog-to-digital converter stage is adjusted.

6. A method of using calibration circuitry to calibrate a pipeline analog-to-digital converter having a plurality of pipeline analog-to-digital converter stages each of which includes a variable gain amplifier having an adjustable gain, the method comprising:
with the pipeline analog-to-digital converter, outputting uncorrected digital codes;
in response to analyzing the uncorrected digital codes, adjusting the gain of the variable gain amplifier with the calibration circuitry to reduce gain error for the data converter circuitry; and
in response to analyzing the uncorrected digital codes, computing code offset values, wherein the code offset values are applied to the uncorrected digital codes to generate corrected digital codes.

7. The method defined in claim 6, wherein at least one stage in the plurality of pipeline analog-to-digital converter stages comprises switched capacitor circuitry, and wherein adjusting the gain with the calibration circuitry comprises tuning an adjustable capacitance circuit associated with the switched capacitor circuitry.

8. The method defined in claim 6, wherein computing the code offset values comprising computing a difference between the uncorrected digital codes and predetermined digital codes.

9. The method defined in claim 6, wherein the pipeline analog-to-digital converter includes an analog-to-digital converter circuit further comprising:
with the analog-to-digital converter circuit, receiving a calibration input signal having a voltage level that is equal to a threshold comparison level associated with the analog-to-digital converter circuit.

10. The method defined in claim 9, wherein the pipeline analog-to-digital converter further includes a digital-to-analog converter circuit coupled in series with the analog-to-digital converter circuit, the method further comprising:
with the digital-to-analog converter circuit, receiving a digital signal from the analog-to-digital converter circuit; and
with the calibration circuitry, forcing digital-to-analog converter circuit to output a selected one of two voltages without regard to the received digital signal.

11. The method defined in claim 6, wherein adjusting the gain of the variable gain amplifier in response to analyzing the uncorrected digital codes comprises adjusting the gain of the variable gain amplifier in response to comparing the uncorrected digital codes with predetermined digital codes.

12. Data converter circuitry, comprising:
a plurality of pipeline stages coupled in series; and
calibration circuitry operable to perform coarse analog error correction and fine digital error correction on at least a portion of the plurality of pipeline stages, wherein each pipeline stage in the portion that is being calibrated includes switched capacitor circuitry, an analog-to-digital converter, and a digital-to-analog converter coupled in series, wherein the analog error correction being performed by the calibration circuitry includes hardware adjustments to at least some of the switched capacitor circuitry, and wherein the hardware adjustments are in place during normal operation of the data converter circuitry.

13. Data converter circuitry, comprising:
a plurality of pipeline stages coupled in series; and
calibration circuitry operable to perform analog error correction and digital error correction on at least a portion of the plurality of pipeline stages; and
a multiplexing circuit coupled between each adjacent pair of pipeline stages in the plurality of pipeline stages, wherein the multiplexing circuit includes a first input operable to receive a calibration input signal from the calibration circuitry and a second input operable to receive control signals from the calibration circuitry.

14. The data converter circuitry defined in claim 12, wherein at least one pipeline stage in a non-calibrated portion of the plurality of pipeline stages comprises a flash analog-to-digital converter.

* * * * *